(12) United States Patent
Ehrenpfordt

(10) Patent No.: US 8,836,099 B2
(45) Date of Patent: Sep. 16, 2014

(54) LEADLESS PACKAGE HOUSING HAVING A SYMMETRICAL CONSTRUCTION WITH DEFORMATION COMPENSATION

(75) Inventor: Ricardo Ehrenpfordt, Weissach (DE)

(73) Assignee: Robert Bosch GmbH, Stuttgart (DE)

( * ) Notice: Subject to any disclaimer, the term of this patent is extended or adjusted under 35 U.S.C. 154(b) by 415 days.

(21) Appl. No.: 12/592,746

(22) Filed: Dec. 1, 2009

(65) Prior Publication Data

US 2010/0148330 A1 Jun. 17, 2010

(30) Foreign Application Priority Data

Dec. 16, 2008 (DE) .......................... 10 2008 054 735

(51) Int. Cl.
| | | |
|---|---|---|
| *H01L 23/06* | (2006.01) | |
| *H01L 23/02* | (2006.01) | |
| *H01L 23/22* | (2006.01) | |
| *H01L 23/24* | (2006.01) | |
| *H01L 23/48* | (2006.01) | |
| *H01L 23/52* | (2006.01) | |
| *H01L 23/00* | (2006.01) | |
| *H01L 23/495* | (2006.01) | |
| *B81B 7/00* | (2006.01) | |
| *H01L 23/31* | (2006.01) | |

(52) U.S. Cl.
CPC ..... B81B 7/0054 (2013.01); *H01L 2924/15747* (2013.01); *H01L 2224/48091* (2013.01); *H01L 2924/01068* (2013.01); *H01L 2924/01014* (2013.01); H01L 24/49 (2013.01); H01L 23/49575 (2013.01); *H01L 2224/48247* (2013.01); H01L 23/562 (2013.01); *H01L 2924/01005* (2013.01); *H01L 2924/014* (2013.01); *H01L 2224/32145* (2013.01); *H01L 2224/73265* (2013.01); *H01L 23/3107* (2013.01); *H01L 2924/01083* (2013.01); *H01L 24/48* (2013.01); *H01L 2224/32245* (2013.01); *H01L 2924/01006* (2013.01); *B81B 2207/012* (2013.01); *H01L 2224/49* (2013.01); *H01L 2924/10253* (2013.01); *H01L 2924/01029* (2013.01); *H01L 2924/01033* (2013.01); *H01L 2924/01082* (2013.01); *H01L 2224/4826* (2013.01)

USPC ............ 257/684; 257/686; 257/687; 257/690

(58) Field of Classification Search
CPC ............. H01L 2924/1433; H01L 2224/32135; H01L 2224/32137; H01L 2224/32141; H01L 2224/32145; H01L 2224/32151; H01L 2224/32221; H01L 2224/48247; H01L 2224/73265; H01L 2224/32245; H01L 2224/48091; H01L 2927/00014; H01L 2224/4826; H01L 2224/49; H01L 23/3107; H01L 23/49575; H01L 23/562; B81B 7/0054; B81B 2207/012

USPC ................... 257/E23.003, E23.001–E23.194, 257/678–786; 438/106–127

See application file for complete search history.

(56) References Cited

U.S. PATENT DOCUMENTS

| | | | |
|---|---|---|---|
| 7,193,302 B2 | 3/2007 | Tseng | |
| 2005/0133916 A1* | 6/2005 | Karnezos | 257/738 |
| 2006/0249282 A1 | 11/2006 | Song | |
| 2006/0249828 A1* | 11/2006 | Hong | 257/686 |
| 2007/0052079 A1 | 3/2007 | Tsai et al. | |
| 2010/0117242 A1* | 5/2010 | Miller et al. | 257/777 |

FOREIGN PATENT DOCUMENTS

CN 1574331 2/2005

* cited by examiner

*Primary Examiner* — Phat X Cao
*Assistant Examiner* — Diana C Vieira
(74) *Attorney, Agent, or Firm* — Kenyon & Kenyon LLP

(57) ABSTRACT

A leadless package for semiconductor elements has at least two semiconductor elements which are situated on a connection region of a lead frame of the leadless package in such a way that when deformations of the semiconductor elements occur, the deformations of the semiconductor elements compensate one another.

13 Claims, 4 Drawing Sheets

LEADLESS PACKAGE HOUSING HAVING A SYMMETRICAL CONSTRUCTION WITH DEFORMATION COMPENSATION

FIELD OF THE INVENTION

1. Background of the Invention

The present invention relates to a leadless package housing for semiconductor elements such as sensor chip elements, ASIC chip elements and other chip elements, and particularly relates to a package housing for a so-called QFN housing or a QFN sensor package.

2. Description of Related Art

Typically, sensors are packaged in lead mold housings or housings having connection contacts bent outward. For this purpose, the individual sensors and ASIC chip elements are set either side-by-side or stacked on top of each other onto a copper substrate or a lead frame and encapsulated or molded in in a molding process and subsequently soldered on circuit boards as a complete element via the bent connection contacts (leads). For placing the silicon component centrally within the mold housing, the lead frames usually have a sunken connection region (die pad having a down-set).

Sensors and semiconductors are increasingly also embedded in so-called QFN housings. In this instance, the housings have no legs or connection contacts extending out of the housing. Instead, they are butt-soldered onto circuit boards. For this purpose, corresponding connection surfaces or connection regions are also integrated in the housing in addition to the chip or sensor components enclosed in the housing.

In housings and the components contained in them, materials are normally used that have different thermal coefficients of expansion, which may result in thermal stresses. Especially sensors react sensitively to bending, which may result from a different thermal expansion of the housing and its components for example.

BRIEF SUMMARY OF THE INVENTION

According to the present invention, an improved package for leadless housings is now provided, in which thermal stresses are at least reduced or essentially prevented.

According to the present invention, a leadless package or a legless package is provided for packaging semiconductor elements, the leadless package having at least two semiconductor elements, which are situated by a connection region of a lead frame of the leadless package in such a way that, when a deformation of the semiconductor elements occurs, e.g. due to thermal stresses, the deformations of the semiconductor elements compensate one another at least partially or essentially completely.

The package according to the present invention has the advantage that the semiconductor elements are specifically situated on the connection region of the lead frame in such a way that, when a deformation of the semiconductor elements occurs due to thermal stresses as a result of different thermal coefficients of expansion of the materials of the package, these deformations are essentially able to compensate one another. That is to say, according to the present invention, deformations running in the opposite direction are specifically produced in the leadless housing, which compensate one another at least partially or essentially completely. This makes it possible, for example, to utilize even delicate sensor chip elements in such a leadless package, which otherwise on account of the strong deformations in the hitherto known housings would display an undesired drift in their sensor signals as a result of induced voltages.

By providing a connection region of the lead frame that is offset in its elevation, it is possible to achieve a symmetrical or nearly symmetrical construction of the leadless package. For this purpose, at least one or multiple semiconductor elements may be disposed on the two sides of the connection region, for example the same number on the topside and the bottom side of the connection region or even an unequal number of semiconductor elements on the two sides of the connection region of the lead frame. In the case of an unequal number of semiconductor elements, the semiconductor elements are arranged in such a way for example that the overall height of all semiconductor elements on each side of the connection region is essentially the same such that the deformations of the semiconductor elements on the two sides of the connection region are able to cancel each other out or at least mutually reduce each other.

In one example embodiment of the present invention, the essentially symmetrical construction of the leadless package has the same number or an unequal number of semiconductor element on the bottom side and top side of a connection region of a lead frame of the package. In this instance, it is possible to provide, for example, an essentially symmetrical structure at least in the region or regions of the package housing where delicate semiconductor elements, e.g. delicate sensor elements, are provided. For example, it is possible for one semiconductor element, e.g. an ASIC chip element, to be situated on one side of a connection region of the lead frame of the leadless package, while two semiconductor element, e.g. sensor elements, are situated side-by-side or one stacked above the other on the other side. For this purpose, the semiconductor elements are arranged in symmetry in such a way that they extend over the same height or overall height and/or the same area or overall area. This makes it possible to produce suitable oppositely directed deformations, it being possible for thermal stresses or for the deformations to cancel each other out, in contrast to the hitherto known packages.

According to another example embodiment of the present invention, the leadless package is a QFN package housing. The present invention, however, is not limited to these examples. Such QFN packages have the advantage that due to the design of the present invention they may also be used for delicate sensor elements, which was hitherto not possible in the related art.

In another example embodiment of the present invention, the connection region of a lead frame of the package is offset in elevation with respect to the connection contacts of the lead frame. In other words, the connection region is raised with respect to the connection contacts of the lead frame or is developed having an elevation offset, for example by deep drawing or another suitable method. This has the advantage of creating a free space such that a semiconductor element may be situated on both sides of the connection region of the lead frame such that the package also may be used particularly in so-called leadless housings such as QFN housings for example.

In one example embodiment of the present invention, at least two or more semiconductor elements are provided stacked one upon the other on the top side and/or on the bottom side of a connection region of a lead frame of the leadless package. Alternatively or in combination with the latter, another example embodiment of the present invention provides for at least two or more semiconductor elements to be situated side-by-side on the top side and/or on the bottom side of a connection region of a lead frame of the leadless package. Both in a side-by-side arrangement of elements on the connection region as well as in a stacked arrangement or a combination of the two, it is thus possible to achieve an essentially symmetrical package that is suitable for compensating for thermal stresses.

According to another example embodiment of the present invention, a semiconductor element on the bottom side of a connection region of a lead frame forms the lower closure of the package. In this instance, the semiconductor element is accessible from below for example, that is, it is not provided with a covering mold layer or cast layer.

In another example embodiment of the present invention, the package is covered on the bottom side with a mold layer or cast layer at least in the region of the semiconductor element such that it is not accessible from outside. In other words, the package has a mold underflow. Since both the top side as well as the bottom side are provided with a mold layer or cast layer, the symmetry of the package is additionally enhanced, the additional mold underflow contributing to another stress reduction.

According to another example embodiment, the overall height and/or overall area of one or more semiconductor elements on one side of the connection region of the lead frame of the leadless package is chosen to be essentially equal or nearly equal to the overall height and/or overall area of one or more semiconductor elements on the opposite side, the number of semiconductor elements on both sides of the connection region of the lead frame of the leadless package being equal or unequal. Even when the number of semiconductor elements on both sides of the connection region differs, the arrangement of the semiconductor elements over essentially the same overall area and/or the same overall height is able to produce oppositely directed deformations, which are capable at least of mutually reducing each other.

In another example embodiment of the present invention, a first semiconductor element is a sensor chip element, which is situated on one side of the connection region of the lead frame, and a second semiconductor element is an ASIC chip element that is situated on the other side of the connection region. In this instance, the connection region of the lead frame may be developed to be somewhat narrower such that the two semiconductor elements e.g. may be connected to each other more easily via corresponding bonding wire connections. Additionally or alternatively, the connection region of the lower semiconductor element may be left exposed by the patterning, or, in other words, the connection region may have one or multiple clearances such that the pads in the lower region are free and the semiconductor elements on the top side and the bottom side of the connection region may be connected to each other via bonding wire connections.

DETAILED DESCRIPTION OF THE INVENTION

Figure 1:
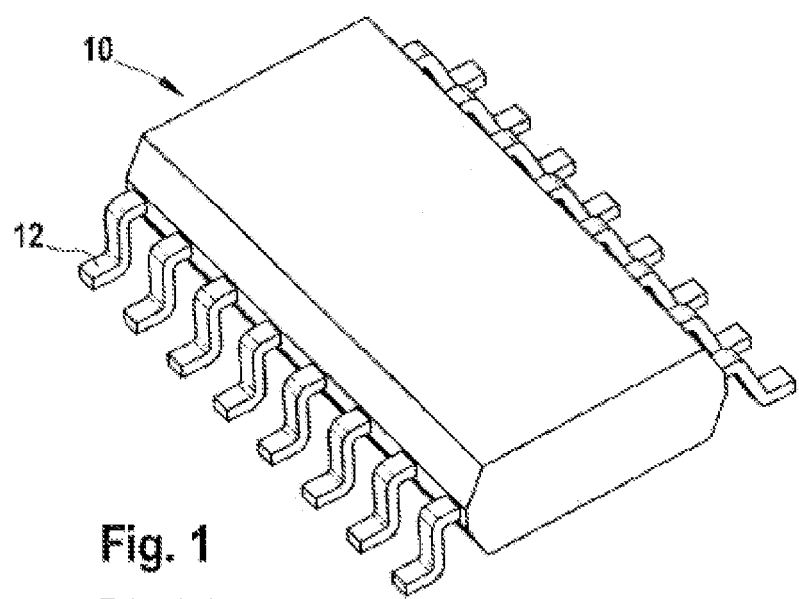
FIG. 1 shows a perspective view of an SOIC full mold housing having connection contacts (leads) according to the related art.

Unless indicated otherwise, identical or functionally equivalent elements and devices have been provided with the same reference numerals in all figures.

FIG. 1 shows first a perspective view of an SOIC (small outline integrated circuit) full mold housing 10 having connection contacts (leads) 12, as known from the related art. In this instance, bent connection contacts 12 (legs) or metal pins are provided on the long sides of housing 10. Connection contacts 12 are angled in such a way that they rest level on a circuit board (not shown), to which the SOIC housing 10 may be connected.

Figure 2:
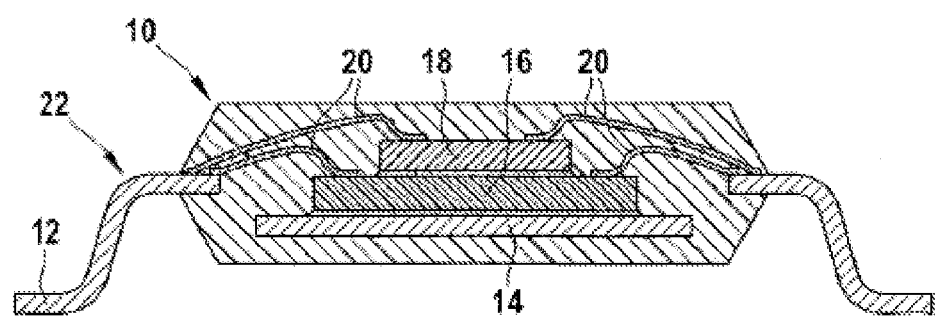
FIG. 2 shows a sectional view of a full mold housing, which has a stacked construction and a sunken connection region (die pad).

Furthermore, FIG. 2 shows a sectional view of a full mold housing 10 according to the related art. Mold housing 10 has a stacked structure of sensors. A sunken connection region (die pad) 14 of a lead frame 22 is provided in housing 10. Furthermore, a first semiconductor element 16 is fastened on connection region 14, and a second semiconductor element 18 is in turn fastened on first semiconductor element 16. The two semiconductor elements 16, 18 may be fastened using an adhesive material for example. Connection contacts 12, which are provided laterally on housing 10, are connected to the two semiconductor elements 16, 18 via bonding wire connections 20. Housing 10 or the package forms a cast connection, in which semiconductor elements 16, 18, lead frame 22 having connection region 14, and bonding wire connections 20 as well as part of connection contacts 12 are encapsulated by a cast material, e.g. plastic.

Figure 3:
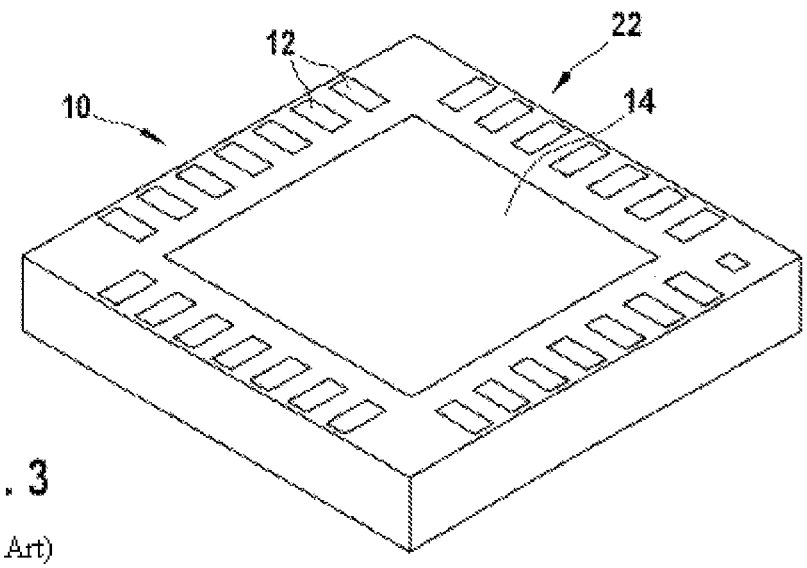
FIG. 3 shows a bottom side of a QFN mold housing.
Figure 4:
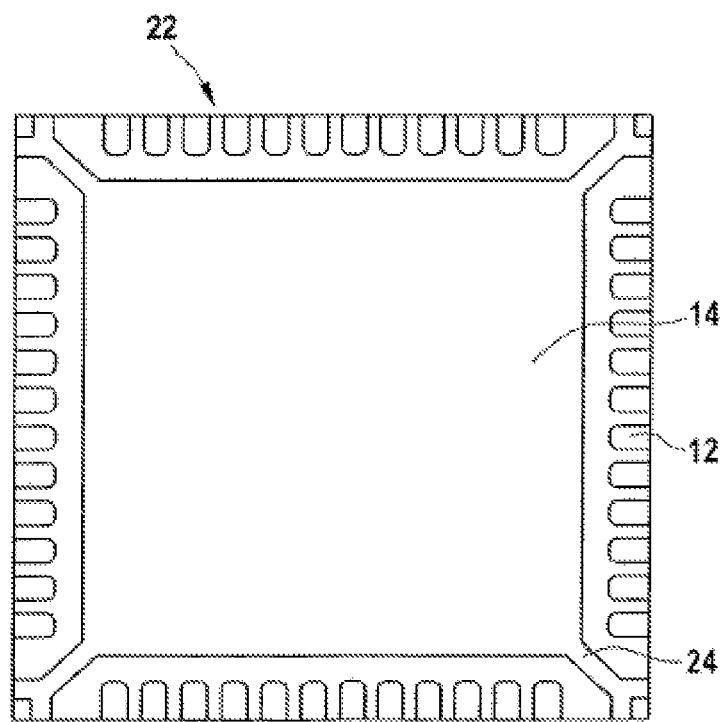
FIG. 4 shows a QFN lead frame (QFN copper lead frame).
Figure 5:
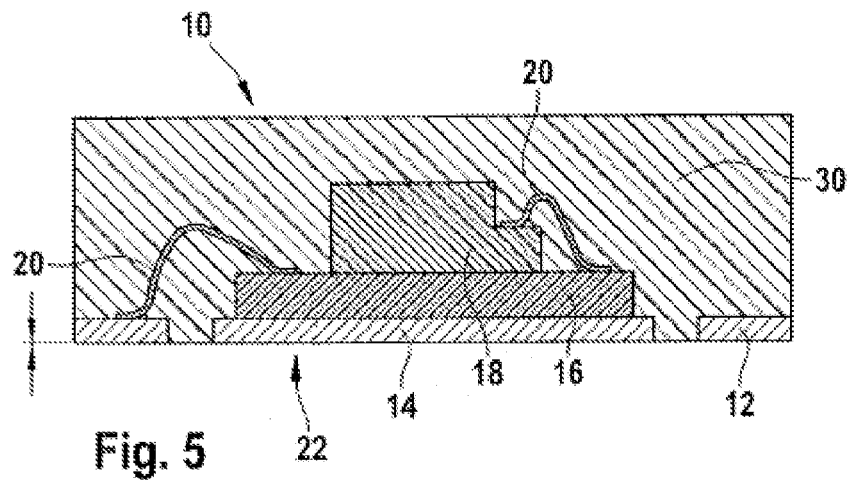
FIG. 5 shows a standard QFN package having a composite stack, the lead frame or the connection region (die pad) being molded over as a lower closure.

In addition to housing 10 described with reference to FIGS. 1 and 2, new, more modern housing forms are now used as well. One of these is the so-called QFN (quad flat non-lead) housing 10. FIGS. 3, 4 and 5 show a package form of a QFN housing 10 as is known from the related art.

FIG. 3 shows QFN mold housing 10 from its bottom side. It is typical for this package form that this so-called leadless housing 10 has no connection contacts or legs bent toward the outside, as the housings 10 described previously with reference to FIGS. 1 and 2. In other words, QFN housing 10 has a leadless package housing or a legless package housing. Instead, in a QFN housing 10, the silicon components mounted on a copper substrate are merely molded over or encapsulated in plastic. The contact to a circuit board is established subsequently by contact surfaces 12 of lead frame 22 on the bottom side of the package of housing 10. FIG. 3 shows the corresponding contact surfaces or connection contacts 12 as well as a centrally provided connection region 14 or connection surface (die pad).

FIG. 4 furthermore shows the QFN copper lead frame 22. This QFN lead frame 22 has connection region (die pad) 14 as well as the rows of connection contacts (contact pads) 12. Furthermore, QFN lead frame 22 has suspension points 24 for connection region 14.

FIG. 5 furthermore shows a sectional view of an example of a QFN housing 10 having a composite stack. QFN housing 10 has a connection region (die pad) 14 as well as connection contacts (contact pads) 12 of a lead frame 22. Connection region 14 and connection contacts 12 of lead frame 22 are on the same plane or level, i.e. they are not on planes offset with respect to each other. An ASIC (application-specific integrated circuit) chip element 16 is provided on connection region 14 for example. ASIC chip element 16 in turn has e.g.

a sensor chip element 18 provided on it, which is connected to ASIC chip element 16 via a bonding wire connection 20. ASIC chip element 16 itself is connected to a corresponding connection contact 12 or connection contacts 12 via a bonding wire connection 20. Furthermore, the two semiconductor elements 16, 18, connection region (die pad) 14, bonding wire connections 20, and connection contacts 12 of lead frame 22 are provided with a mold coating 30 or encapsulated in plastic.

As shown in FIG. 5, lead frame 22 and connection region (die pad) 14 are molded over as a lower closure. In other words, housing 10 has connection contacts 12 or contact surfaces on the bottom in order to provide an electrical contact to a circuit board (not shown). Furthermore, connection region 14 is provided as accessible from the outside on the bottom of the package surface of housing 10.

Figure 6:
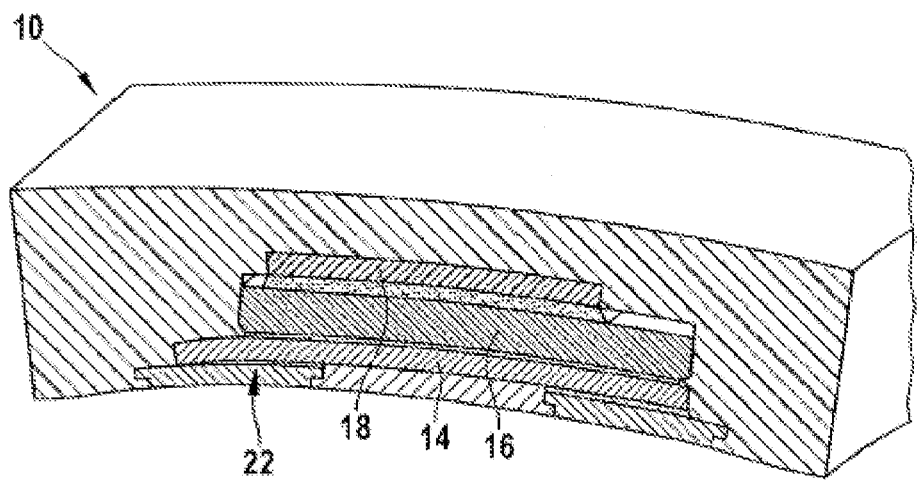
FIG. 6 shows a schematic representation of a deformation of a housing and of the silicon chip element provided therein because of thermal stresses.

Within mold housing 10, however, as shown in FIG. 6, a deformation or a bending of housing 10 or its package may occur as a result of temperature influences. In exemplary fashion, FIG. 6 shows the deformation of a housing 10 in which an ASIC chip element 16 and a silicon chip element 18 for example, are situated and fastened one upon the other on a connection region (die pad) 14 of a lead frame 22 having contact connections. Due to its non-symmetrical structure and the lack of thermal compatibility of the materials of housing 10 and its elements 16, 18, housing 10 together with its two semiconductor elements 16, 18 are bent considerably.

Such a deformation of housing 10 as a result of temperature influences occurs due to the different thermal coefficients of expansion of the materials of housing 10 and its elements, in this case the two semiconductor elements 16, 18 and an associated lack of thermal fit of the different materials. As a result, stresses may be induced in housing 10 by changes in temperature. In a sensor chip element built into housing 10, these stresses in turn may negatively affect its sensor signals. More precisely, an undesired drift may occur in the sensor signals. It was precisely this stress behavior that led in the past to a use of premold housings that were less susceptible to stress, but also clearly more cost-intensive.

In so-called leadless housings 10, for example the QFN housings previously described with reference to FIGS. 3, 4 and 5, normally only lead frame 22 fitted with one or more silicon components is molded over or encapsulated. Lead frame (copper lead frame) 22 thus represents the lower closure of housing 10, as shown in FIG. 5, and thus does not allow for a symmetrical composite stack. Stacking the silicon chips on both sides of copper lead frame 22 in accordance with the present invention is thus neither thought of nor possible in hitherto known QFN housings as a compensation measure for reducing thermal stresses.

Figure 7:
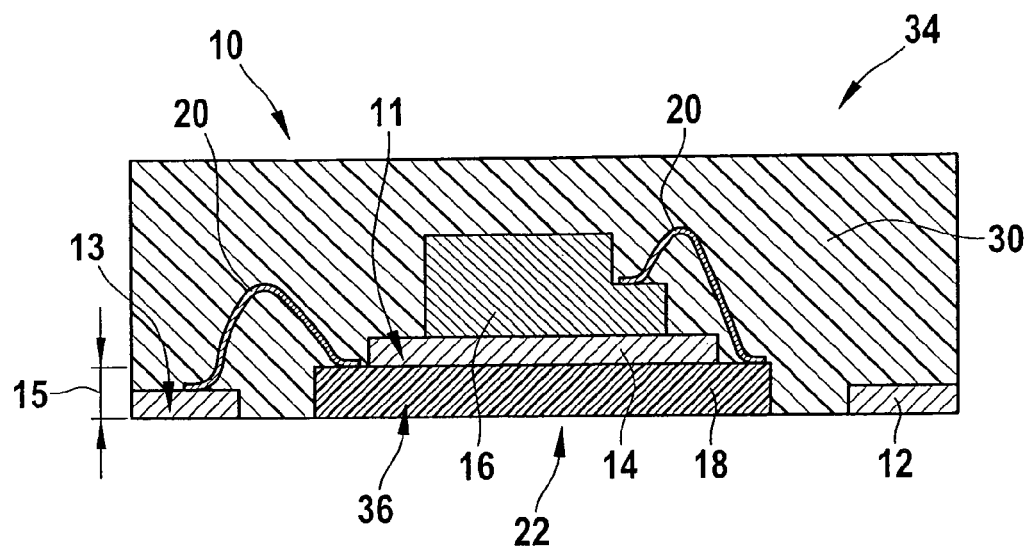
FIG. 7 shows a QFN package according to a first example embodiment of the present invention.
Figure 8:
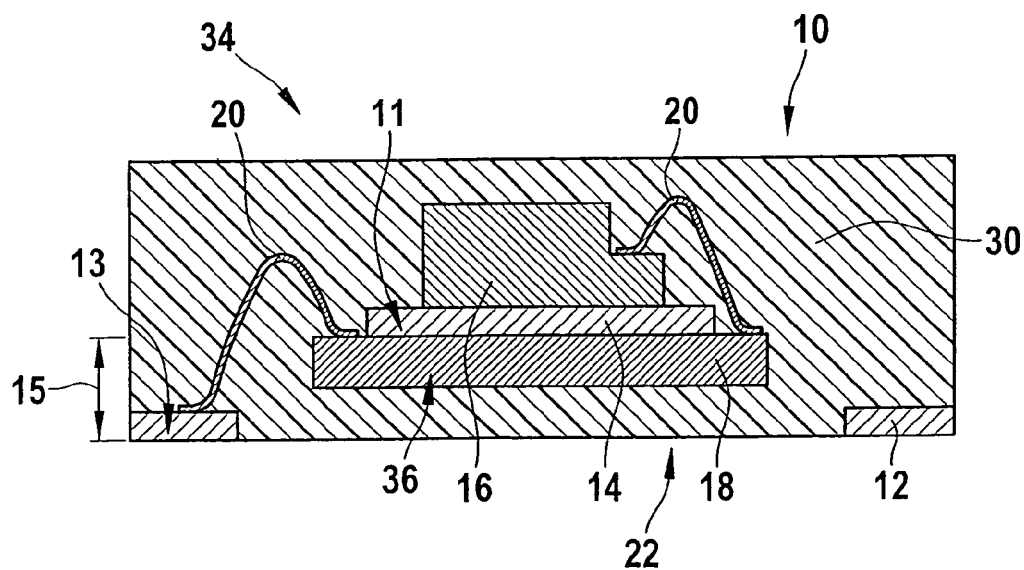
FIG. 8 shows a QFN package according to a second example embodiment of the present invention.

FIG. 7 now shows a first exemplary embodiment of a leadless package 34 according to the present invention as may be used in QFN package housings. According to a specific embodiment of the present invention, as shown in FIGS. 7 and 8, a symmetrical package construction is made possible by a suitable modification of lead frame 22 or its connection region 14, which achieves a stress compensation in leadless housings 10 such as e.g. QFN housings.

According to the example embodiment of the present invention as shown in FIG. 7, an up-set (negative down-set) of connection region (die pad) 14 of QFN lead frame 22 is performed in order to reduce stresses in package housing 34. The free space 36 thus created between the lower housing closure and connection region 14 of lead frame 22 may be used for mounting, for example, one, two or more semiconductor elements 16, 18. For this purpose, semiconductor elements 16, 18 may be arranged and fastened for example side-by-side and/or stacked on top of each other on the top side and/or on the bottom side of connection region 14 of lead frame 22.

An essentially symmetrical construction of leadless package 34 may be achieved in that the same number of semiconductor elements 16, 18 are situated on the top side and the bottom side of connection regions 14 for example, i.e. at least one, two or more semiconductor elements 16, 18 on both sides of connection region 14. It is also possible, however, to dispose an unequal number of semiconductor elements 16, 18 on the top side and on the bottom side of connection region 14 of lead frame 12. In this case, however, the overall height of semiconductor elements 16, 18 on both sides of connection region 14 should be the same or nearly the same if possible in order to achieve a symmetry in which deformations of the different materials or elements of housing 10 may suitably compensate each other. Thus it is possible, for example, to dispose a relatively tall ASIC chip element on one side of the connection region and to dispose two lower profile sensor chip elements stacked one on top of the other on the other side. The two sensor chip elements have an overall height that is preferably as close as possible to the height of the ASIC chip element, or the overall height of the semiconductor elements on both sides of the connection region is preferably essentially equal or nearly equal. This form of symmetry may also achieve a compensation of the deformation resulting from different materials etc.

In a first step for example, lead frame 22 having connection region (die pad) 14 may be stamped out, cut out and/or etched out as a flat piece, and connection region 14 may be subsequently bent upward or deep-drawn in order to raise it, so to speak, and to create the corresponding free space 36 or an elevation offset 15 between plane 11 of connection region 14 and plane 13 of connection contacts 12. It is also possible, however, first to deep-draw or shape connection region (die pad) 14 accordingly upward and to create elevation offset 15 and subsequently to stamp out, cut out and/or etch out lead frame 22 having connection region (die pad) 14. The present invention, however, is not limited to these methods of manufacturing lead frame 22 having connection region 14.

In the exemplary embodiment as shown in FIG. 7, connection region 14 is for example offset or raised with respect to connection contacts 12 of lead frame 22 by the height of lower semiconductor 18, e.g. an ASIC chip element. Lower semiconductor element 18, i.e. the semiconductor element on the bottom side of connection region 14, may in this case form the closure of housing 10 on the bottom and be developed to be accessible, as shown in FIG. 7, or may be enclosed on the bottom by a molding mass or casting material (not shown) and thus be inaccessible from the bottom. Another semiconductor element 16, for example a sensor chip element, is situated on the top side of connection region 14. The two semiconductor elements 16, 18 may be connected to each other via a bonding wire connection 20. In this case, connection region 14 or the die pad may be designed somewhat narrower, for example, as shown in FIG. 7, and/or be provided with one or multiple clearances (not shown) for corresponding wire bond pad regions or bonding wire connections of a semiconductor element 16, 18 situated on the bottom side and/or top side of connection region 14.

In the example, as shown in FIG. 7, e.g. one or both semiconductor elements 16, 18, e.g. the ASIC chip element, may be connected to one or multiple connection contacts 12 via a corresponding bonding wire connection 20. Because of the interplay of semiconductor element 18 on the bottom side of connection region 14, another silicon chip element 16 on the top side of connection region 14 or of the connection surface (die pad) may produce a symmetrical or essentially symmetrical composite succession of semiconductor elements 16, 18. In other words, a composite succession of a lower silicon chip element Si, a (in this case copper) lead frame Cu and an upper silicon chip element Si (Si⇒Cu⇒Si) may be created. In the event of temperature changes for example, this essentially symmetrical construction is able to bring about oppositely directed deformations that are essentially able to cancel each other out. In other words, the occurring stresses are able essentially to compensate or at least reduce each other.

Plane 11 of connection region 14 of lead frame 22 is in this case offset in elevation with respect to a plane 13 of connection contacts 12. The elevation or elevation offset 15 may be varied at will depending on how many semiconductor elements 16, 18 are situated stacked one upon the other on the bottom side of connection region 14 and how tall the individual semiconductor elements 16, 18 are or how great their overall height is in case they are stacked one upon the other. This applies to all specific embodiments according to the present invention.

FIG. 8 shows another exemplary embodiment of the specific embodiment according to the present invention. In this case, connection region (die pad) 14 is offset in elevation with respect to connection contacts 12 of lead frame 22 to such an extent or has an elevation offset 15 of such a magnitude that a semiconductor element situated on the bottom side of connection region 14 or semiconductor elements arranged side-by-side do not form the bottom of housing 10, but rather the bottom is formed by a mold underflow or a casting mass 30 of plastic, for example. The respective semiconductor element 16, 18 may be, e.g., an ASIC chip element or sensor chip element etc.

By raising connection region 14 accordingly or by an elevation offset 15 (up-set) of connection region 14 of a respective magnitude it is thus possible to form a mold underflow or casting material underflow 20, as shown in FIG. 8. The elevation offset 15 between plane 11 of connection region 14 and plane 13 of connection contacts 12 is greater than in FIG. 7 such that the bottom below the lowermost semiconductor element 18 may be filled with casting mass. In this instance, it is possible to achieve a symmetrical or essentially symmetrical composite succession (with respect to the number of semiconductor elements) in that the same number of semiconductor elements 16, 18 are situated for example on the top side and bottom side of connection region 14. As shown e.g. in FIGS. 7 and 8, at least one or more semiconductor elements 16, 18 may be situated on both sides of connection region 14. Alternatively, in order to achieve a symmetrical or essentially symmetrical construction with respect to dimension, it is also possible to position an unequal number of semiconductor elements 16, 18 on the top side and on the bottom side of connection region 14 of lead frame 12. The overall height of semiconductor elements 16, 18 in terms of dimension, however, is essentially equal or nearly equal on both sides of connection region 14. For this purpose, a relatively tall ASIC chip element may be disposed on one side of the connection region 14 and two lower profile sensor chip elements may be stacked one upon the other on the other side. As described previously with reference to FIG. 7, the two sensor chip elements have an overall height that is as close as possible to the height of the ASIC chip element or the overall height of the semiconductor elements on both sides of the connection region is essentially equal or nearly equal.

As shown in FIG. 8, in the exemplary embodiment of the present invention, e.g. an ASIC chip element 18 (Si) may be situated and fastened on the bottom side of connection region 14 of (e.g. copper) lead frame CU and a silicon chip element 16 (Si) on the top side of connection region 14. This results in a composite package sequence of a layer made of a molding material or casting material MC, ASIC chip element Si, lead frame or its connection region Cu, silicon chip element Si and again a layer or ply of a molding material or casting material MC such as e.g. plastic (MC⇒Si⇒Cu⇐Si⇐MC).

A decisive advantage of the present invention is thus to produce the so-called leadless housings 10, such as QFN housings for example, as a symmetrical package 34 with respect to its composite stack (number of semiconductor elements) and/or dimensioning (e.g. overall height) and thus to reduce or essentially prevent thermal deformations of housing 10 in that oppositely directed deformations are produced by the symmetrical construction, which are able to compensate each other at least partially or essentially entirely. Thus it is possible to counteract an undesired strong bending of silicon chip elements in leadless housing 10 and a resulting undesired signal drift, for example in sensor chip elements.

In contrast to the example embodiment of the present invention, the standard QFN lead frame has the connection region (die pad) at the same elevation or level as the connection contacts or contact pads as lower closure, as shown in FIGS. 4 and 5. Because of the unsymmetrical stacking, i.e. in this case by providing the two chip elements Si on one side of the lead frame Cu (Cu⇒Si⇒Si), a bending or deformation of housing 10 may result as a consequence of the different thermal coefficients of expansion of the materials and their lack of thermal fit. The deformation of housing 10 and of semiconductor elements 16, 18 contained therein such as e.g. sensor chip elements and ASIC chip elements etc. may result in a signal drift and thus in inaccuracies.

According to the example embodiment of the present invention, lead frame 11, in this case, e.g., the copper lead frame, is modified. During the manufacturing process, connection region (die pad) 14 is bent upward (up-set) from the elevation level of connection contacts (contact pads) 12, as shown in FIGS. 7 and 8. The technology for this is known among the manufacturers of lead frames since a lowering (down-set) of connection region 14 is performed in lead frames 22 for full mold housings 10, as shown in FIGS. 1 and 2.

As additionally indicated in FIG. 4, connection region (die pad) 14 in QFN lead frame 22 is tied to the corners of the connection region by four crosspieces for example and may be very readily offset in terms of depth or elevation e.g. by deep drawing. The elevation offset (up-set) according to the present invention, for example for QFN packages 34, results in an elevation level difference 15 between connection contacts (contact pads) 12 as the lower closure of leadless housing 10 and connection region (die pad) 14, as shown in FIGS. 7 and 8. This free space 36 may be used for positioning at least one or more semiconductor elements 16, 18, which are bonded to connection region 14 (die attach) with their connection pads facing upward. For this purpose, an adaptation of the connection region geometry or the die pad geometry is expedient as well. The connection region geometry should be structured in such a way that the connection contacts (contact pads) 12 of the e.g. bonded semiconductor element 16, 18 are not covered and are contactable for example from above by bonding wire connections 20.

In the two example embodiments in FIGS. 7 and 8, the connection region (die pad) 14 may be designed for example somewhat narrower than semiconductor element 16, 18 on one or both sides. Semiconductor element 18 is for example an ASIC chip element that is situated on the bottom side of connection region 14. Second semiconductor element 16, which is situated on the top side of connection region 14, is a sensor chip element for example. The present invention, however, is not limited to theses kinds of semiconductor elements 16, 18. The mentioned semiconductor elements 16, 18 are only exemplary and serve to explain the present invention. In the example, sensor chip element 16 is fastened to connection region 14 by an adhesive and makes contact with ASIC chip element 18 or is connected to it via a corresponding bonding wire connection 20. This produces a symmetrical composite sequence made up for example of respectively at least one semiconductor element Si on each side of lead frame Cu or its connection region (Si⇒Cu⇐Si).

Depending on the size of the offset of connection region 14 introduced with respect to connection contacts (contact pads) 12, lower semiconductor element 18, in this case the ASIC chip element in the examples in FIGS. 7 and 8, may act as a lower closure, as shown in FIG. 7, or may be provided with a mold underflow or cast layer 30, as shown in FIG. 8. Mold underflow or cast layer 30 has the advantage that it results in an additional stress reduction since the symmetry of the structure is further improved by the two-sided mold coating or cast coating 30. The main function of the present invention is thus the achievement of a symmetrical or essentially symmetrical composite sequence (Si⇒Cu⇐Si) in leadless housings 10 such as e.g. QFN mold housings by introducing an elevation offset for connection region (die pad) 14 in lead frame 22. In QFN package 34, the symmetrical composite sequence may result in a reduction of thermal deformations, as described above, since the deformations resulting from different thermal coefficients of expansion (like bi-metal) may be mutually compensating. The leadless package housing of the present invention may thus be used inter alia in relatively delicate sensors or sensor chip elements etc. and other semiconductor elements in a leadless housing such as e.g. a QFN housing. In this instance, a signal drift resulting from a lack of fit of materials having different thermal coefficients of expansion may at least be reduced or essentially prevented. This makes it possible for sensors in the future to be provided or packaged also in leadless housings such as QFN housings etc., for example for an ESP system in a motor vehicle, to mention one example out of numerous possible applications.

What is claimed is:

1. A leadless package for packaging semiconductor elements, comprising:
   a lead frame having a connection region; and
   at least two semiconductor elements situated on the connection region of the lead frame in such a way that, in the event of deformations of the at least two semiconductor elements, the deformations of the at least two semiconductor elements at least partially compensate one another,
   wherein a surface of at least one of the semiconductor elements is in contact with the bottom side of the leadless package,
   wherein at least one semiconductor element is situated respectively on a top side and on a bottom side of the connection region of the lead frame, the semiconductor element on one side of the connection region being a sensor chip element and the semiconductor element on the other side of the connection region being an ASIC chip element, and wherein at least one additional semiconductor element is positioned on the sensor chip element, the overall height of the sensor chip element and of the at least one additional semiconductor element being substantially equal to the overall height of the ASIC chip element.

2. The leadless package as recited in claim 1, wherein the leadless package has an essentially symmetrical configuration.

3. The leadless package as recited in claim 2, wherein the leadless package is a quad flat non-lead (QFN) package housing.

4. The leadless package as recited in claim 3, wherein the connection region of the lead frame is situated higher with respect to connection contacts of the lead frame.

5. The leadless package as recited in claim 4, wherein the essentially symmetrical configuration of the leadless package has an equal number of semiconductor elements on the bottom side and top side of the connection region of the lead frame.

6. The leadless package as recited in claim 5, wherein at least one of overall height and overall area of semiconductor elements on one side of the connection region is substantially equal to corresponding at least one of overall height and overall area of semiconductor elements on the opposite side of the connection region.

7. The leadless package as recited in claim 6, wherein at least two semiconductor elements are situated one on top of the other on the top side and on the bottom side of the connection region of the lead frame.

8. The leadless package as recited in claim 6, wherein at least two semiconductor elements are situated side-by-side on each of the top side and the bottom side of the connection region of the lead frame.

9. The leadless package as recited in claim 7, wherein the lowermost semiconductor element on the bottom side of the connection region of the lead frame forms a lower portion of the leadless package, and wherein the lowermost semiconductor element on the bottom side of the connection region is accessible from below.

10. The leadless package as recited in claim 7, wherein the lowermost semiconductor element on the bottom side of the connection region of the lead frame forms a lower portion of the leadless package, and wherein the leadless package has one of a mold layer or a cast layer on the bottom side such that the lowermost semiconductor element on the bottom side of the connection region is inaccessible from below.

11. The leadless package as recited in claim 6, wherein the connection region of the lead frame has a clearance for corresponding one of a wire bond pad region or a bonding wire connection of a semiconductor element situated on the connection region.

12. The leadless package as recited in claim 6, wherein the at least two semiconductor elements situated on the connection region are one of a chip element, a micromechanical sensor element on silicon basis, an acceleration sensor element, an ASIC chip element, or a rotation rate sensor element.

13. The leadless package as recited in claim 1, wherein the surface of the at least one of the semiconductor elements is flush with the bottom side of the leadless package.

* * * * *